United States Patent [19]

Edwards et al.

[11] Patent Number: 5,706,171

[45] Date of Patent: Jan. 6, 1998

[54] FLAT PLATE COOLING USING A THERMAL PASTE RETAINER

[75] Inventors: David Linn Edwards, Poughkeepsie; Sushumna Iruvanti, Wappingers Falls; Gaetano Paolo Messina; Raed A. Sherif, both of Hopewell Junction, all of N.Y.

[73] Assignee: International Business Machines Corporation, Armonk, N.Y.

[21] Appl. No.: 560,568

[22] Filed: Nov. 20, 1995

[51] Int. Cl.$^6$ .................................................. H05K 7/20
[52] U.S. Cl. .......................... 361/705; 257/717; 361/719
[58] Field of Search .......................... 165/81, 86.2, 185, 165/133, 134.1, 905, 104.33; 361/689, 704, 717–719, 705, 706, 713; 174/16.3, 76, 52.2; 257/706, 707, 712–714, 717, 719, 727

[56] References Cited

U.S. PATENT DOCUMENTS

| | | | |
|---|---|---|---|
| 4,607,277 | 8/1986 | Hassan | 357/81 |
| 4,612,978 | 9/1986 | Cutchaw | 165/104.3 |
| 4,630,172 | 12/1986 | Stevenson | 361/386 |
| 4,852,646 | 8/1989 | Dittmer et al. | 165/185 |
| 4,860,444 | 8/1989 | Herrell | 357/81 |
| 5,022,462 | 6/1991 | Flint et al. | 165/80.4 |
| 5,052,481 | 10/1991 | Horvath et al. | 165/185 |
| 5,251,100 | 10/1993 | Fujita et al. | 361/719 |
| 5,276,586 | 1/1994 | Hatsuda et al. | 361/387 |
| 5,394,299 | 2/1995 | Chu | 361/705 |
| 5,561,323 | 10/1996 | Andros | 257/707 |

Primary Examiner—Gerald P. Tolin
Attorney, Agent, or Firm—Whitham, Curtis, Whitham & McGinn; Tiffany L. Townsend

[57] ABSTRACT

Thermal material such as a paste or gel is confined within a paste gap between a surface of a flat cooling plate and an opposing surface of a chip mounted on a surface of a chip carrier or substrate by forming a partition, preferably in the form of a grid, at the periphery of one or more chips. The partition is located laterally in sufficient proximity to the chip and in communication with the paste gap to form a capillary and thus confine motion of a viscous thermal material to repetitive bidirectional flow out of and into the paste gap with relative motion of the chip and the surface of the flat cooling plate. The grid is preferably fitted closely within grooves formed in the surface of the flat cooling plate and preferably supported by leaf springs so that thermal material is confined within cells of the grid while providing support and/or damping of relative motion between the flat cooling plate and the substrate or carrier.

18 Claims, 2 Drawing Sheets

5,706,171

FLAT PLATE COOLING USING A THERMAL PASTE RETAINER

DESCRIPTION

BACKGROUND OF THE INVENTION

1. Field of the Invention

The present invention generally relates to packaging of electronic devices generally of a modular type including a plurality of chips and, more particularly, to such devices which are attached or formed integrally with structures including a compliant thermal material such as a thermal grease or gel for removing heat from the chips during operation.

2. Description of the Prior Art

Since the invention of the transistor, dissipation of heat during operation has been an important consideration in semiconductor device package design. Heat can damage the delicate and tiny structures which allow transistors to function as intended in respective designs. Power drawn by transistors, field effect transistors and other electronic devices, including the connections between them must be dissipated to avoid build up of heat and the development of high temperatures which can degrade the devices by such mechanisms as dopant diffusion and metal migration including solder softening and reflow.

As is known, a bipolar transistor ideally does not draw power during periods when it is quiescent or saturated but only while switching or modulating current therethrough. In practice, however, some power is drawn and must be dissipated at all times, even in digital switching and logic circuits which are primarily in either a quiescent or saturated state. However, power drawn by bipolar transistors increases rapidly with switching speed and clock rate which is emphasized in current data processing circuit designs.

Field effect transistors (FETs), which are becoming more generally used in digital data processing integrated circuits, especially integrated circuits formed at high integration density, exhibit a non-negligible channel resistance and, functioning as voltage-controlled variable resistors, draw some amount of power at all times during operation and in proportion to the current which they conduct. As an incident of integrated circuit design, however, the channel of a field effect transistor requires the principal portion of the chip area occupied by the transistor while the width and length of the channel determine the channel resistance. The length of the channel must be designed in view of the voltage at which the device is to operate; the reduction of operating voltage tending to compromise memory device function. Therefore, in modern logic and digital data processing circuits, the channel width is carefully engineered in view of loads on each transistor, balancing power dissipation against integration density.

The speed of operation and other operational characteristics such as noise immunity of integrated circuits can generally be enhanced by increased integration density since decreases in circuit element size (e.g. FET gates) and conductor length generally reduce drive current requirements of the electronic devices and reduce capacitive coupling between circuit elements, thus improving immunity to noise. Further, the number of devices which can be placed on a single chip generally increases manufacturing economy as well as reducing the cost and noise susceptibility of forming connections between chips. Therefore, in recent years, substantial emphasis has been placed on techniques and structures for removing heat from integrated circuit devices.

Heat transfer is impeded by both boundary conditions at surfaces of structures and the heat capacity (e.g. specific heat) and heat conductance properties of structures, including cooling fluids such as air which may circulate by natural convection and/or be mechanically circulated. For example, so-called thermal greases and gels have been developed and have been in use for many years for the purpose of forming intimate contact with both semiconductor packages, such as power transistors, and heat removal structures such as heat sinks and so-called cold plates which may have a cooling fluid circulated though passages therein in order to carry heat to remotely located heat transfer structures. High performance thermal materials in the form of a gel and suitable for practice of the present invention are disclosed in U.S. Pat. No. 4,852,646 to Dittmer et al. which is hereby fully incorporated by reference. Due to the intimacy of contact with both devices and the excellent heat conductance characteristics of the thermal grease or gel as well as the thinness of the grease when installed between the semiconductor package and the heat removal structure in many installations, the thermal grease can substantially increase heat transfer away from an electronic package. However, if intimacy of contact with a heat removal structure is not maintained over a significant area of the package, the interfaces with and thickness of the thermal grease may present an impedance to heat flux despite the relatively high thermal conductivity of currently available thermal greases and gels.

Accordingly, it must be recognized that the interface between the semiconductor chips on which the many transistors and other electronic devices are formed and a heat removal structure also impedes heat transfer. When many integrated circuit chips are mounted on a modular structure, the intimacy of thermal contact with a heat removal structure can only be achieved with difficulty and substantial process complexity. For example, U.S. Pat. No. 5,251,100 to Fujita et al. teaches an arrangement and methodology in which a chip surface arranging plate (CSAP) is bolted to a cooling arrangement and chips are connected to the CSAP with solder after applying a vacuum to attract the chip surfaces to the CSAP to establish a surface defined by surfaces of all chips which conforms to the CSAP. Interstices between chips and the module providing inter-chip connections and a heat removal structure forming a "cap" or "hat" for the package are then filled with thermal compounds such as thermal greases or low melting point solder. However, in so doing, metallization of surfaces of the chips and other surfaces to be bonded is required. The CSAP sits on the chip; hence, the chip area in contact with the thermal grease or gel is reduced. Additionally, the use of a conductive material such a solder can affect the functionality of the chips if required processes are not carried out perfectly.

U.S. Pat. No. 5,276,586 to Hatsuda et al. provides ceramic heat conduction members on respective chips to conduct heat to the module cap and includes a reservoir with an affinity for a bonding agent such as solder to receive excess amounts thereof. As with Fujita et al., described above, mislocation of conductive solder can affect chip functionality and decrease manufacturing yield, particularly if solder bonding agents spill over from one chip site to another if the intended effects of the reservoir are inadequate to prevent such spillage. Some other heat conduction structures are disclosed in U.S. Pat. No. 5,022,462 which uses a flexible sheet of thermally conductive material with upstanding fins and U.S. Pat. No. 5,052,481 which includes a thermally conductive oil and internal fins.

In summary, while many arrangements and structures are known for removing heat from semiconductor devices, simpler arrangements have marginal performance and are of inadequate thermal performance for dissipation of power from very high density integrated circuits, particularly when operated at high clock or switching rates. Known arrangements and structures having higher thermal performance generally involve complex structures and process requirements which increase cost and can reduce manufacturing yield. Generally, these latter arrangements and structures are only marginally adequate, at best, for removal of heat from state-of-the-art digital data processing circuit modules despite their high economic cost.

A simple yet effective arrangement for heat removal from electronic devices is done by so-called flat plate cooling (FPC) in which a flat plate is placed as closely as possible to the chip and the gap between the chip and the flat plate is filled with a thermal grease or gel. The grease or gel has sufficient compliance and viscosity to absorb the loads generated by the assembly process without transmitting those loads to the chips or interconnections of the package. The flat plate is generally attached to either a heat sink or a cold plate, in which a cooling fluid (e.g. air or water) is circulated to remove heat. This heat removal technique is simple but generally provides high heat removal capability. In order to increase the effectiveness of this cooling technique, it is generally desired to have a thermal grease or gel of high thermal conductivity and used in the smallest possible gap. An example of thermal grease suitable for use in such an arrangement and the invention is IBM Advanced Thermal Compound (ATC); the thermal conductivity of which is around 2.8 W/m°K and can be placed in gaps ranging from 0.001 to 0.1 inches in single-chip or multi-chip modules.

It has been found, however, that thermal cycling (e.g. power on, power off cycling) tends to squeeze the thermal grease or gel out of the small gap it occupies between the chip and the flat plate. Thermal cycling causes the chip carrier to flex in the direction perpendicular to the flat plate surface which reduces the size of the gap occupied by the thermal grease or gel. Depending on the magnitude of the flexure and the thermal grease or gel properties, the spillage of thermal grease or gel out of the gap may leave some areas of the chip uncovered, leading to increased and irregular chip temperatures.

Temperature gradients developing in the substrate and flat plate during power on and power off and the ensuing thermal expansion of the substrate and flat plate tend to increase the squeezing of the thermal grease or gel and spillage thereof. Further, larger thermal gradients and larger squeezing forces result from increased power dissipation in the devices. The squeezing effect on the thermal grease or gel is aggravated when the squeezing motion becomes a proportionally larger fraction of the paste gap either as the paste gap is reduced by design or as uncovered areas of the chip increase; causing increase of thermal gradients and consequent flexure.

By increasing the paste gap to reduce the effect of the squeezing motion on the thermal grease or gel, the thermal performance of the module is degraded even with advanced thermal greases due to increased thermal resistance. Further, if the paste gap is increased, the thermal grease or gel may sag, especially under the influence of gravity or other acceleration forces in some orientations of the package. These effects are aggravated by higher temperatures which greatly reduce the viscosity of thermal greases or gels. It should be appreciated that both this effect, like the squeezing effect described above become greater over time as areas not covered by thermal grease increase, resulting in higher temperatures and thermal gradients within the package. Thus, while small paste gaps may be desirable to reduce the latter effect, small paste gaps can aggravate the formal effect and vice-versa, limiting the ability to control thermal performance over time.

It should also be recognized that other components such as decoupling capacitors may be mounted on modular circuit structures and may limit the degree to which small paste gaps can be accomplished. Further, larger paste gaps can provide substantial manufacturing economies when some reduction in thermal performance is tolerable. Therefore, regardless of the paste gap chosen for a particular design, known devices are subject to movement of paste and loss of thermal performance by one or both of the above-described mechanisms, although in differing relative degrees.

Given the cooling requirements have reached extreme levels in state-of-the-art modular circuit packages and designs, any loss of cooling capacity after a device is placed in service, particularly if not controlled or predictable, can lead to catastrophic failure and/or malfunction of the chips, module, any electronic device containing such a module or even a network to which the electronic device is connected. Accordingly, there is a need to limit movement of compliant thermal materials, regardless of the mechanism of such movement which does not transmit forces to the chips and which may thus cause damage thereto.

SUMMARY OF THE INVENTION

It is therefore an object of the present invention to provide a structure for containment and limiting of motion of thermal materials in FPC arrangements.

It is another object of the invention to provide an arrangement and method of obtaining the full benefits of FPC techniques and structures without developing susceptibility to uncontrolled loss of cooling capacity.

It is a further object of the invention to provide a structure and methodology which can maintain the position of thermal materials in small paste gaps while accommodating larger components mounted on modular circuit structures other than integrated circuit chips.

It is yet another object of the invention to provide a structure and methodology which can maintain the position of thermal greases or gels or other thermal interface materials in either small or large paste gaps to provide reliable cooling for integrated circuit chips.

In order to accomplish these and other objects of the invention, a retainer grid or partition is provided adjacent to a lateral side of a chip to form a capillary in communication with the paste gap so that compliant thermal material may move slightly but sufficiently in a bidirectional manner to avoid developing mechanical forces against the chip or chips while preventing the development of gaps in the compliant thermal material.

In accordance with one aspect of the invention, an electronic package is provided including at least one chip mounted on a surface of a carrier, a cooling arrangement having a surface opposing a surface of the chip and the carrier and defining a paste gap for containing a viscous thermal material, and a partition surrounding a the chip and spaced from the chip to form a capillary at a periphery of the chip.

In accordance with another aspect of the invention, a method of confining thermal materials within a paste gap between a chip mounted on a carrier and a surface of a cooling means within an electronic package is provided, including the step of forming a capillary at a periphery of said chip extending from said paste gap.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
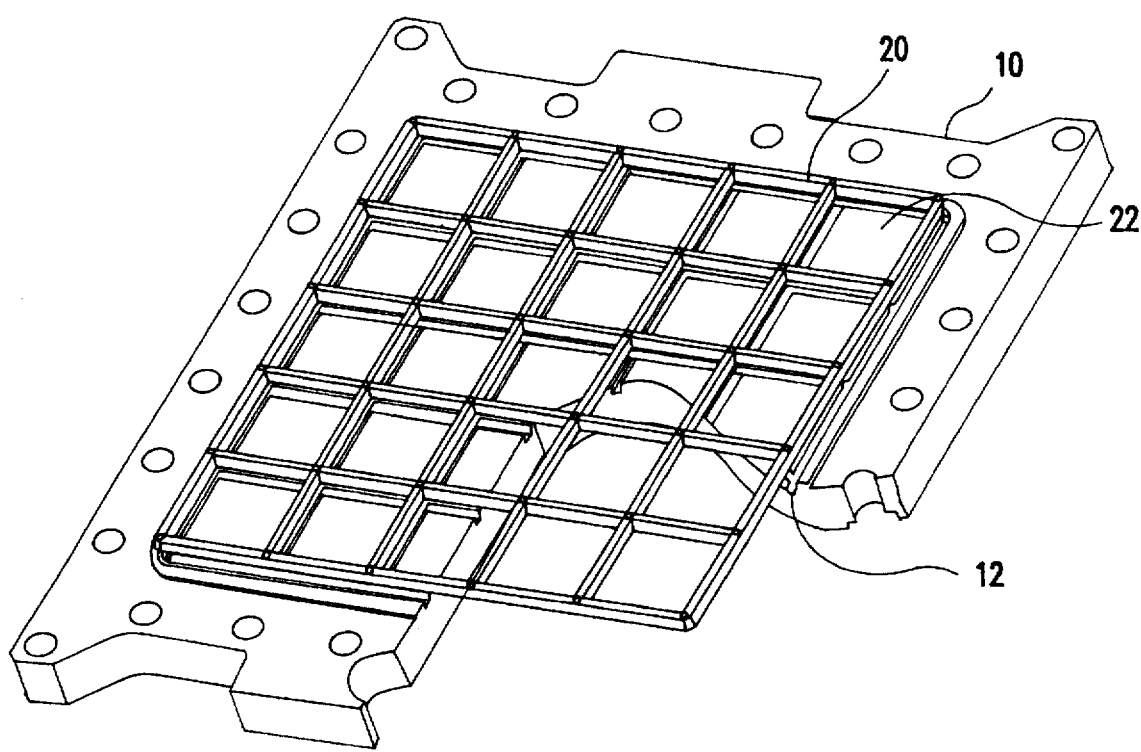
FIG. 1 is an isometric view of a grid embodying the invention on a flat cooling plate suitable for attachment of a modular circuit or carrier of a plurality of modular circuit package thereto.

Referring now to the drawings, and more particularly to FIG. 1, there is shown, in exploded isometric view of a partially cut away flat cooling plate 10, modified in accordance with the invention, overlaid with a retainer grid 20 which cooperates with the modified flat cooling plate 10 and a modular circuit or carrier (not shown in FIG. 1, for clarity) on which one or more modular circuits may be mounted to provide improved confinement of thermal materials in accordance with the invention. Specifically, the retainer grid 20 is formed, preferably of metal, plastic or ceramic with a pattern of cells 22 which correspond to the sizes, shapes (e.g. rectangular) and locations of chips mounted on one of more carriers or substrates. The heat conductivity of the material from which the retainer grid is formed is not critical since it is not directly in the heat transfer path, Nevertheless, metal, plastic or ceramic materials having a relatively high thermal conductance are preferred. It should, however, be understood that the invention can be practiced to advantage with an individual chip so mounted and that the grid cell shape should follow the shape of the chip and may be rectangular, as shown, circular, hexagonal or any other convenient shape. As will be described below, the transverse dimensions of cells 22 exceeds the transverse dimensions of respective chips by a distance at least equal to the paste gap but it should be understood that the function of the invention is governed by the minimum anticipated viscosity and surface tension of the thermal paste or gel rather than the particular paste gap chosen.

This lateral clearance between the cells 22 of the retainer grid and the chips should be designed in view of ease of registration during assembly, chip density on the carrier, anticipated or empirically known or estimable relative motion of the chips 32 and grid 20 in a direction parallel to the plane of carrier 30 during power-on and power-off operations, volumetric change of the paste gap due to both motion 44 and chip area, lateral thermal expansion of the chips and the viscosity and surface tension with respect to the material of the grid 20 of the thermal grease or gel. The latter condition is perhaps most important but somewhat adjustable by choice of thermal material.

The flat cooling plate (FPC) 10 is preferably modified by the formation (e.g. by machining, casting, etching, etc.) of grooves 12 therein to conform to the pattern of cells 22 formed by grid 20. The grooves should fit the grid closely but allow sliding motion of the grid within the grooves with small force. Such a force can advantageously be supplied by a leaf spring, preferably of a resilient metal sheet, patterned similarly to the grid but with preferably greater clearance within the grooves 12, and into which a gentle wave shape is impressed or otherwise formed. Of course, the leaf spring need not be provided in all regions of the grid. Individual (e.g. linear) leaf springs provided in all or only some of the individual grooves 12 are also suitable for practice of the invention.

Figure 2:
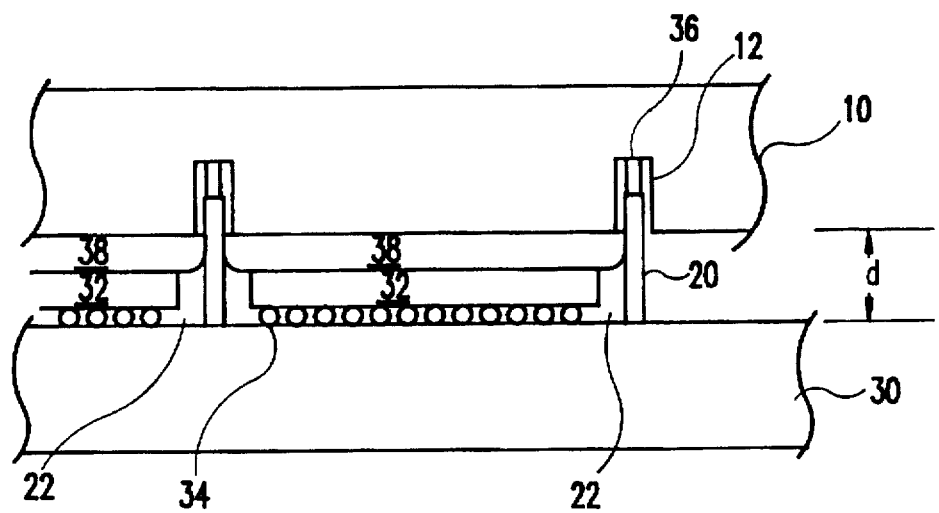
FIG. 2 is a cross-sectional view of the invention assembled with a modular package and a flat cooling plate structure.
Figure 2A:
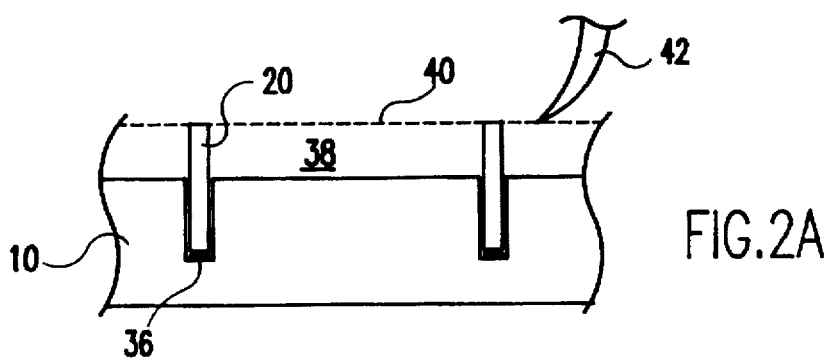
FIG. 2A shows a preferred technique of applying thermal paste to the structure of FIG. 2 in accordance with a preferred aspect of the invention.

Referring now to FIG. 2, the arrangement shown in FIG. 1 is shown in cross-section, assembled with a chip carrier 30 having chips 32 mounted thereon by methods (such as solder bumps 34 of the so-called C4 type, illustrated) which are not otherwise important to the practice of the invention. Leaf springs 36, in accordance with a preferred embodiment of the invention, are illustrated between the bottoms of grooves 12 and grid 20, urging grid 20 into contact with carrier 30. The depths of grooves 12 should be designed in consideration of the tolerance of dimension d in the assembly (which is greatly exaggerated in FIGS. 2 and 3 in the interest of clarity). The depth of grooves 12 can also aid in the dispensing of appropriate quantities of thermal material (e.g. paste, grease or gel) by forcing the grid 20 to the bottom of the grooves 12 (preferably against the leaf spring 36) and applying thermal material 38 to the remaining protrusion height 40 of grid 20, such as with a squeegee 42, as illustrated in FIG. 2A (with the FPC inverted from the position shown in FIG. 2). Thus, the grid 20 serves to confine a suitable amount of thermal paste, grease or gel 38 in a small paste gap between the surface of chip 32 and FPC 10.

Figure 3:
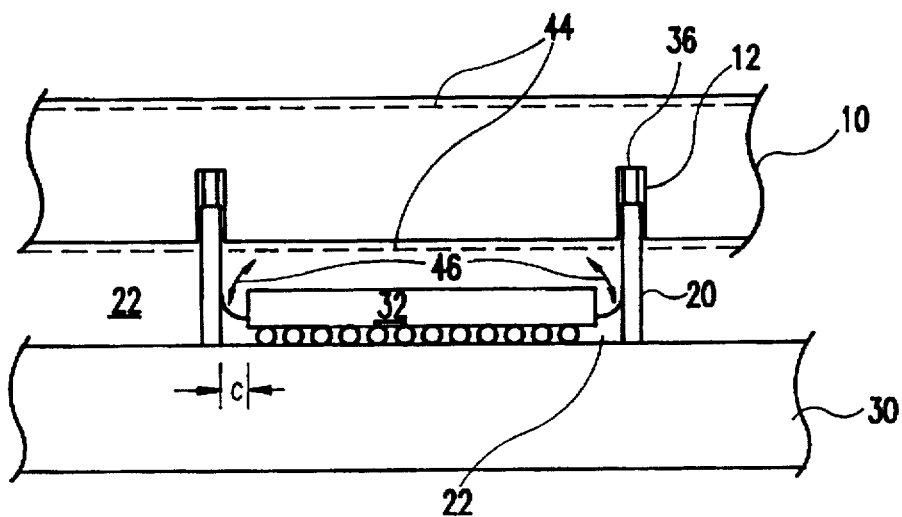
FIG. 3 is an enlarged portion of the cross-section of FIG. 2 illustrating the function of the invention.

As alluded to above, there is relative motion between the FPC 10 and chips 32 and carrier 30, particularly due to changing thermal gradients (and possibly capacitive attraction) during power-on and power-off operations, as schematically depicted by dashed lines 44 in FIG. 3. Particularly if the paste gap is small, this relative motion tends to squeeze the thermal material 38 from the paste gap. It is not desirable to completely fill the space surrounding the chip 32 with thermal material since such greases, pastes or gels are relatively incompressible and may thus cause mechanical damage such as cracking or crushing of the chip 32 during such relative motion. The thermal material squeezed out of the paste gap may thus be transferred from chip to chip and allow voids to form in the thermal material in the paste gap when the assembly returns to the normal dimensions and clearances such as are shown in FIG. 2.

The partitions provided by grid 20 between chips 32, serve to confine the thermal material during such relative motion and dimensional changes in the assembly; forming a capillary in accordance with the surface tension and viscosity of the thermal material so that motion of the thermal material is bidirectional and repeatable, as shown by arrows 46, preventing the formation of voids in the thermal material. The dimensions of the clearance c and its angular form also provides some damping to the motion 44 and regulates forces which may be transmitted to the chips 32 during such relative motion. It should be understood that this function would be supported by the structure of the invention even if leaf springs were not provided and the grid 20 did not reach the surface of substrate or chip carrier 30. For example, the invention could be embodied by upstanding partitions (or corresponding recesses between such partitions) formed integrally with FPC 10. Similarly, discontinuities in the grid such as slots providing clearance for mounting of electronic components other than integrated circuit chips, such as decoupling capacitors, are tolerable as long as capillary action is not compromised. However, for long-term stability of the thermal material positioning, it is desirable that the grid prevent transfer of thermal materials between cells 22.

Further, in the preferred arrangement illustrated, leaf springs 36 and grid 20 provide support between the FPC 10 and carrier 30 at locations between all chips, tending to reduce motion 44. Additionally, in view of the pressure excursions in the thermal material caused by viscous flow in clearance c, some thermal material may be caused to enter grooves 12 which, in view of their small volume relative to cells 22 can provide further support against and damping of motion 44, tending to increase stability of location of thermal material 38 over time and dimensional cycling.

While providing numerous advantages in the practice of the invention, grooves 12 are not necessary to the primary function of the invention in the confinement of thermal materials. Nevertheless, simply as an incident of assembly convenience and to assure that lateral motion of the grid 20 does not compromise the capillary action described above, it is preferred that some structure such as pins or tabs mating with recesses or a recess surrounding the entirety of grid 20 be provided on the grid 20 and at least one of FPC 10 and carrier or substrate 30.

In view of the foregoing, it is seen that the invention provides containment and limiting of motion of thermal material to maintain effectiveness of FPC cooling arrangements and to thus avoid uncontrolled loss of cooling capacity even as paste gaps are reduced and chip areas and temperature excursions are increased. By the same token, the invention provides for enhanced cooling effects by allowing reduction of paste gaps at will and within chip mounting height tolerances without the requirement of complex process requirements which may compromise manufacturing yields and severely increase production costs. The invention also allows increase of paste gaps insofar as thermal performance allows in order to exploit manufacturing economies while avoiding the principal mechanism of degradation of thermal performance when large paste gaps are employed.

While the invention has been described in terms of a single preferred embodiment, those skilled in the art will recognize that the invention can be practiced with modification within the spirit and scope of the appended claims. For example, the cells of the grid can be formed to surround a small number of chips rather than each chip and plural carriers can be accommodated on the same FPC by articulation of one or more grids 20 or, using a single grid, by spacing between cells thereof.

Having thus described our invention, what we claim as new and desire to secure by Letters Patent is as follows:

1. An electronic package including:
   at least one chip mounted on a surface of a carrier,
   a cooling means having a surface opposing a surface of said at least one chip and said carrier,
   a space between said at least one chip and said surface of said cooling means defining a paste gap containing a viscous thermal material, and
   a partition surrounding at least a major portion of said at least one chip and spaced therefrom and forming a capillary at a periphery of said at least one chip, said capillary containing said viscous thermal material.

2. An electronic package as recited in claim 1, wherein at least a portion of said partition receives an electronic component other than an integrated circuit chip.

3. An electronic package as in claim 1, wherein said partition is connected to said cooling means and said carrier, said partition defining a cell retaining said thermal material and said chip.

4. An electronic package as in claim 1, wherein said partition is connected to said cooling means via elastic means.

5. An electronic package as in claim 1, wherein said electronic package is a chip/substrate/cover structure.

6. An electronic package including:
   at least one chip mounted on a surface of a carrier,
   a cooling means having a surface opposing a surface of said at least one chip and said carrier,
   a space between said at least one chip and said surface of said cooling means defining a paste gap containing a viscous thermal material, and
   a partition surrounding at least a major portion of said at least one chip and spaced therefrom and forming a capillary at a periphery of said at least one chip said, capillary containing said thermal material,
   wherein said partition is fired within a groove in said surface of said cooling means.

7. An electronic package as recited in claim 6, wherein said partition is in the form of a grid received within said groove.

8. An electronic package as recited in claim 7, further including a leaf spring interposed between a bottom of said groove and said grid.

9. An electronic package including:
   at least one chip mounted on a surface of a carrier,
   a cooling means having a surface opposing a surface of said at least one chip and said carrier,
   a space between said at least one chip and said surface of said cooling means defining a paste gap containing a viscous thermal material, and
   a partition surrounding at least a major portion of said at least one chip and spaced therefrom and forming a capillary at a periphery of said at least one chip, said capillary containing said thermal material,
   wherein said partition contacts a surface of said carrier.

10. An electronic package as recited in claim 8, wherein said grid contacts a surface of said carrier.

11. A structure for mounting art electronic component comprising:
    a carrier connected to said component;
    a thermal material contacting said component;
    cooling means contacting said thermal material; and
    a grid connected to said carrier and said cooling means, said grid including cells having a dimension larger than that of said component, one of said cells receiving said component, such that said grid causes said thermal material to be retained substantially between said component and said cooling means.

12. A structure as in claim 11, wherein said grid contacts said cooling means via elastic means, so as to permit relative movement between said carrier and said cooling means.

13. A structure as in claim 12, wherein said grid contacts said cooling means by a connection comprising an elastic leaf spring.

14. A structure as in claim 11, wherein said cooling means includes grooves receiving said grid.

15. A structure as in claim 11, wherein said grid is integral with said carrier.

16. A structure for mounting an electronic component comprising:
    a carrier connected to said component:
    a thermal material contacting said component:
    cooling means contacting said thermal material: and
    a grid connected to said carrier and said cooling means, said grid including cells having a dimension larger than that of said component, one of said cells receiving said component, such that said grid causes said thermal material to be retained substantially between said component and said cooling means,
    wherein said grid includes partitions which substantially surround said component, said partitions being spaced from said component such that said partitions cause capillary action of said thermal material around said component.

17. An electronic package as in claim 4, wherein said elastic means comprises springs.

18. A structure as in claim 11, wherein said structure for mounting an electronic component is a chip/substrate/cover structure.

* * * * *

UNITED STATES PATENT AND TRADEMARK OFFICE
CERTIFICATE OF CORRECTION

PATENT NO. : 5,706,171
DATED : January 6, 1998
INVENTOR(S) : David Linn Edwards, et al.

It is certified that error appears in the above-identified patent and that said Letters Patent is hereby corrected as shown below:

On the title page: Item [56]

under Attorney, Agent or Firm, delete "Tiffany L. Townsend"

Signed and Sealed this

Twenty-third Day of June, 1998

Attest:

BRUCE LEHMAN

Attesting Officer      Commissioner of Patents and Trademarks